(12) United States Patent
Nummerdor

(10) Patent No.: US 9,581,288 B2
(45) Date of Patent: Feb. 28, 2017

(54) BRACKET FOR RF MONOBLOCK FILTER AND FILTER-PCB ASSEMBLY INCORPORATING THE SAME

(71) Applicant: Jeffery J. Nummerdor, Rio Rancho, NM (US)

(72) Inventor: Jeffery J. Nummerdor, Rio Rancho, NM (US)

(73) Assignee: CTS CORPORATION, Lisle, IL (US)

( * ) Notice: Subject to any disclaimer, the term of this patent is extended or adjusted under 35 U.S.C. 154(b) by 663 days.

(21) Appl. No.: 14/053,170

(22) Filed: Oct. 14, 2013

(65) Prior Publication Data

US 2014/0104016 A1   Apr. 17, 2014

Related U.S. Application Data

(60) Provisional application No. 61/714,284, filed on Oct. 16, 2012.

(51) Int. Cl.

| | | |
|---|---|---|
| H01P 1/205 | (2006.01) | |
| F16M 13/02 | (2006.01) | |
| H03H 7/01 | (2006.01) | |
| H03H 1/02 | (2006.01) | |
| H05K 1/02 | (2006.01) | |

(52) U.S. Cl.
CPC ............. *F16M 13/02* (2013.01); *H01P 1/205* (2013.01); *H01P 1/2056* (2013.01); *H03H 1/02* (2013.01); *H03H 7/0138* (2013.01); *H05K 1/0271* (2013.01); *H05K 1/0233* (2013.01); *H05K 1/0243* (2013.01); *H05K 2201/068* (2013.01); *H05K 2201/1006* (2013.01)

(58) Field of Classification Search
CPC ....... H01P 1/2056; H01P 1/2053; H01P 1/205
USPC ................ 333/206, 204, 202, 222, 200, 134
See application file for complete search history.

(56) References Cited

U.S. PATENT DOCUMENTS

| | | | |
|---|---|---|---|
| 4,692,726 A | 9/1987 | Green et al. | |
| 4,742,562 A | 5/1988 | Kommrusch | |
| 4,954,796 A * | 9/1990 | Green ................... | H01P 1/2056 333/202 |
| 5,130,682 A * | 7/1992 | Agahi-Kesheh ....... | H05K 3/301 333/202 |
| 5,144,269 A | 9/1992 | Itoh | |
| 5,214,398 A | 5/1993 | Hayashi | |
| 5,239,280 A | 8/1993 | Noguchi et al. | |
| 6,903,625 B2 * | 6/2005 | Esker ...................... | H01P 5/185 333/116 |

* cited by examiner

*Primary Examiner* — Dinh T Le
(74) *Attorney, Agent, or Firm* — Daniel Deneufbourg

(57) ABSTRACT

A combination RF filter and printed circuit board assembly wherein the RF filter is defined by a block of dielectric material including at least first and second side surfaces. A metal bracket with a plurality of fingers is secured to each of the first and second side surfaces. The fingers on the brackets extend through respective apertures in the printed circuit board and are soldered to the printed circuit board. The brackets relieve and transfer the thermal and mechanical stresses that result from use of a filter and printed circuit board that are made of materials with different thermal and mechanical characteristics and reduce the risk of cracking or damage to the filter, the printed circuit board, and the solder joints during use.

2 Claims, 4 Drawing Sheets

BRACKET FOR RF MONOBLOCK FILTER AND FILTER-PCB ASSEMBLY INCORPORATING THE SAME

CROSS-REFERENCE TO RELATED APPLICATIONS

This application claims the benefit of the filing date of U.S. Provisional Patent Application Ser. No. 61/714,284 filed on Oct. 16, 2012 and entitled, "Bracket for RF Monoblock Filter and Filter/PCB Assembly Incorporating the Same", the entire disclosure of which is explicitly incorporated herein by reference as are all references cited therein.

TECHNICAL FIELD

This invention relates to dielectric block filters for radio-frequency signals and, in particular, to a stress relief and transfer bracket for RF monoblock dielectric filters and a combination RF filter and printed circuit board assembly incorporating such a bracket.

BACKGROUND OF THE INVENTION

Ceramic monoblock filters offer several advantages over lumped component filters. The blocks are relatively easy to manufacture, rugged, and relatively compact. In the basic ceramic block filter design, the resonators are formed by typically cylindrical passages, called through-holes, extending through the block from the long narrow side to the opposite long narrow side. The block is substantially plated with a conductive material (i.e. metallized) on all but one of its six (outer) sides and on the inside walls formed by the resonator through-holes.

Ceramic monoblock filters are typically mounted and soldered to printed circuit board assemblies (PCBs) which, depending upon the particular application and environment in which the combination filter and PCB assembly is used, is subject to both thermal and vibration stresses that increase the risk of cracking or damage to either the solder joints or the ceramic material of the filter.

The present invention is directed to a bracket and combination filter and PCB assembly that minimizes the risk of cracking or damage to the filter during use.

SUMMARY OF THE INVENTION

The present invention is directed generally to a bracket for an RF filter comprising a plate adapted to be secured to a side of the RF filter and means for securing the plate to a substrate.

In one embodiment, the means for securing the plate to the substrate comprises a plurality of fingers on the plate adapted to be inserted through respective apertures defined in the substrate.

In one embodiment, the fingers of the plate are soldered to the surface of the substrate.

The present invention is also directed to an RF filter assembly that comprises an RF filter which includes a block of dielectric material having opposed first and second side surfaces, and first and second brackets secured to the opposed first and second side surfaces of the block of the RF filter and adapted for securement to a printed circuit board.

In one embodiment, the first and second brackets each include a plurality of fingers adapted to be inserted through respective apertures defined in the printed circuit board.

In one embodiment, the plurality of fingers on the first and second brackets are soldered to the surface of the printed circuit board.

The present invention is further directed to a combination RF filter and printed circuit board assembly that comprises a printed circuit board, an RF filter coupled to the printed circuit board, and at least a first bracket coupled to the RF filter and extending through the printed circuit board.

In one embodiment, the printed circuit board defines a plurality of apertures and the at least first bracket includes a plurality of fingers that extend through the plurality of apertures respectively in the printed circuit board and are secured to the printed circuit board.

In one embodiment, the at least first bracket is in the form of a flat plate secured to a side of the RF filter.

In one embodiment, the combination RF filter and printed circuit board assembly comprises at least first and second brackets in the form of first and second flat plates secured to opposed first and second sides of the filter.

In one embodiment, the printed circuit board includes an exterior surface, the RF filter including a core having a top surface located opposite and spaced from the exterior surface of the printed circuit board and a plurality of walls which extend outwardly from the top surface and define a top peripheral rim abutted against the exterior surface of the printed circuit board.

There are other advantages and features of this invention, which will be more readily apparent from the following detailed description of the embodiment of the invention, the drawings, and the appended claims.

BRIEF DESCRIPTION OF THE FIGURES

In the accompanying drawings that form part of the specification, and in which like numerals are employed to designate like parts throughout the same.

DETAILED DESCRIPTION OF THE PREFERRED EMBODIMENT

While this invention is susceptible to embodiment in many different forms, this specification and the accompanying drawings disclose one embodiment of a combination RF monoblock filter and PCB assembly 100 (FIGS. 1, 2, and 3) comprising an RF monoblock filter 200 (FIGS. 1, 2, 3, 4, and 6); a substrate or printed circuit board (PCB) 300 (FIGS. 1, 2, and 3); and a pair of filter stress relief and transfer brackets 400 (FIGS. 1, 2, 3, 4, and 5).

Figure 6:
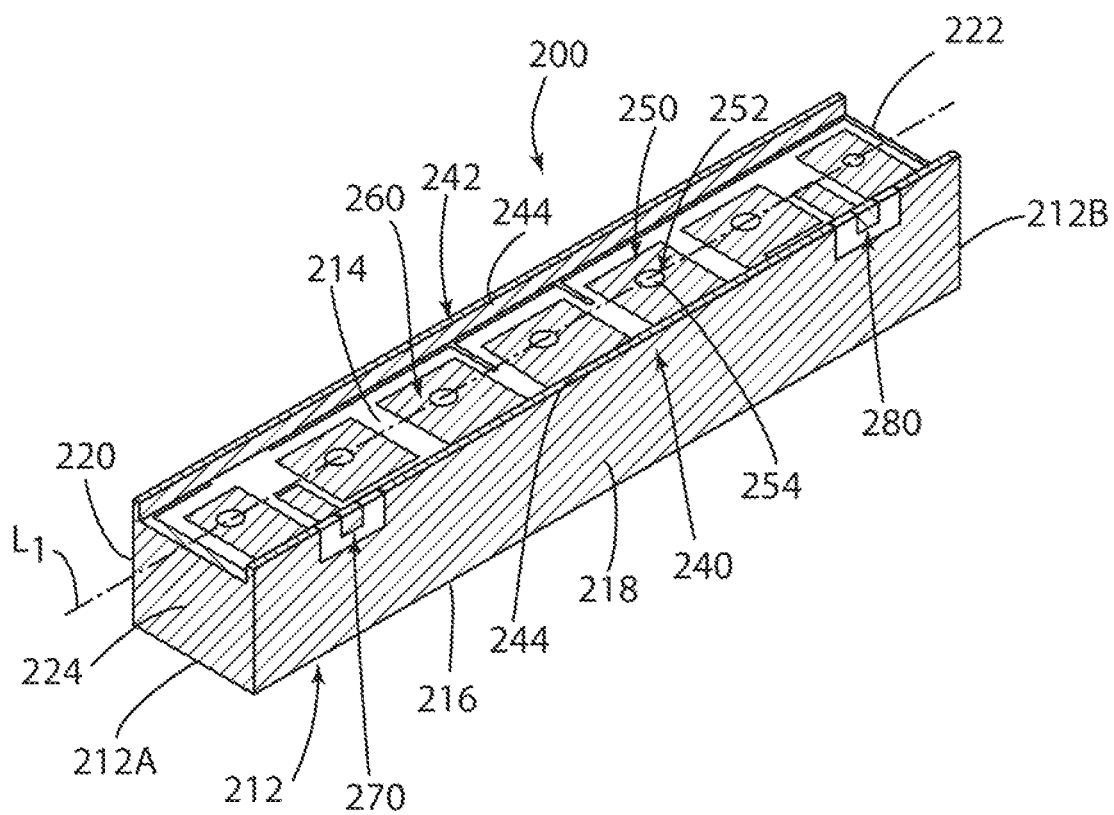
FIG. 6 is a perspective view of one embodiment of an RF monoblock filter of the combination RF monoblock filter and PCB assembly of FIG. 1.

The radio frequency (RF) monoblock filter 200 as more specifically shown in FIG. 6 comprises, in one embodiment, a generally elongate, parallelepiped or box-shaped rigid block or core 212 comprised of a ceramic dielectric material having a desired dielectric constant. In one embodiment, the dielectric material can be a barium, alumina, or neodymium ceramic with a dielectric constant of about 12 or above.

Core 212 includes opposed ends 212A and 212B and defines an outer surface with six generally rectangular sides: a top side or top longitudinally and horizontally extending surface 214; a bottom side or bottom longitudinally and horizontally extending surface 216 that is parallel to and diametrically opposed from top surface 214; a first longitudinally and vertically extending side or side surface 218 on a first side of, generally parallel to, and spaced from the core longitudinal axis $L_1$; a second longitudinally and vertically extending side or side surface 220 that is parallel to and diametrically opposed and spaced from side surface 218 and on a second opposite side of, generally parallel to, and spaced from the core longitudinal axis $L_1$; a third side or end surface 222 that extends between, and in a relationship generally transverse to, the one ends of the top and bottom surfaces 214 and 216 respectively and the core longitudinal axis $L_1$; and a fourth side or end surface 224 that is parallel to and diametrically opposed and spaced from end surface 222 and extends between, and in a relationship generally transverse to, the other of the ends of the top and bottom surfaces 214 and 216 respectively and the core longitudinal axis $L_1$.

The core 212 and the respective longitudinally extending side surfaces 218 and 220 respectively additionally define a pair of generally planar, vertical, and elongated walls 240 and 242 that protrude, project, and extend upwardly and outwardly away from the top surface 214 of the core 212 and, more specifically, upwardly and outwardly from the outer and upper longitudinally extending peripheral edge of the first and second side surfaces 218 and 220 respectively of the core 212. In the embodiment shown, the walls 240 and 242 are generally co-planar with the respective first and second side longitudinally extending surfaces 218 and 220 respectively and extend longitudinally along, and the length of, the respective first and second longitudinally extending side surfaces 218 and 220 between the side surfaces 222 and 224.

Walls 240 and 242 are parallel and diametrically opposed to each other and extend on opposite sides of, and in a relationship generally parallel to and spaced from, the central longitudinal axis of the core 212. Each of the walls 240 and 242 includes a top peripheral and generally horizontal rim 244.

The filter 200 also includes a plurality of resonators 250 defined in part by a plurality of metallized through-holes 252 which are defined in dielectric core 212 and extend from and terminate in openings 254 in the top surface 214 and openings (not shown) in the bottom surface 216.

Top surface 214 of core 212 additionally defines a surface-layer recessed pattern 260 of electrically conductive metallized and insulative unmetallized areas or patterns including a pair of isolated conductive metallized areas or electrodes 270 and 280 for input and output connections to filter 200. An input connection area of conductive material or electrode or elongate surface-layer strip of conductive material 270 and an output connection area of conductive material or electrode or elongate surface-layer strip of conductive material 280 are defined on top surface 214, extend onto the wall 240, and define respective surface mounting conductive connection points or pads or contacts.

Figure 1:
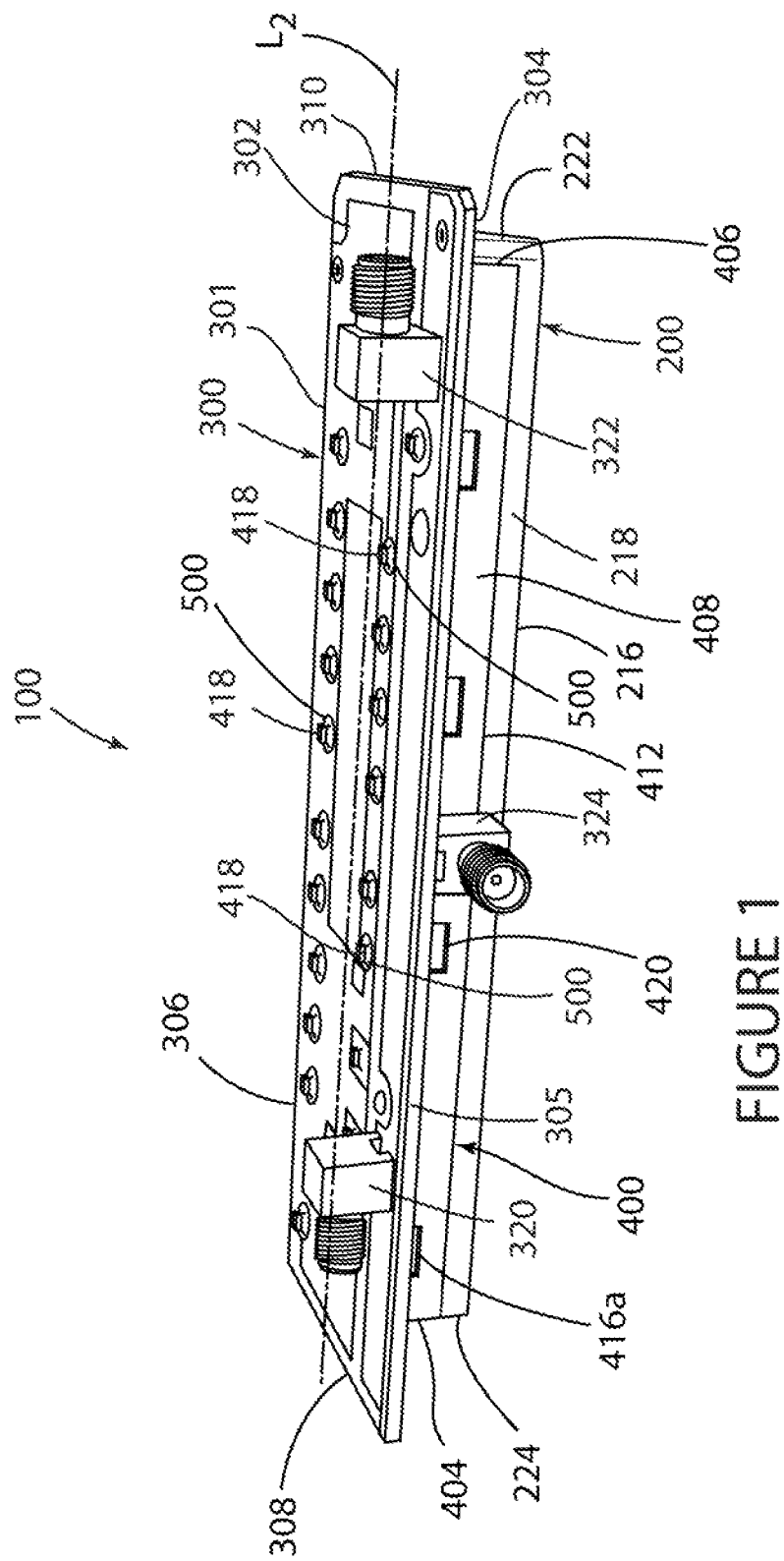
FIG. 1 is a perspective view of a combination RF monoblock filter and PCB assembly in accordance with the present invention incorporating a pair of brackets in accordance with the present invention.
Figure 2:
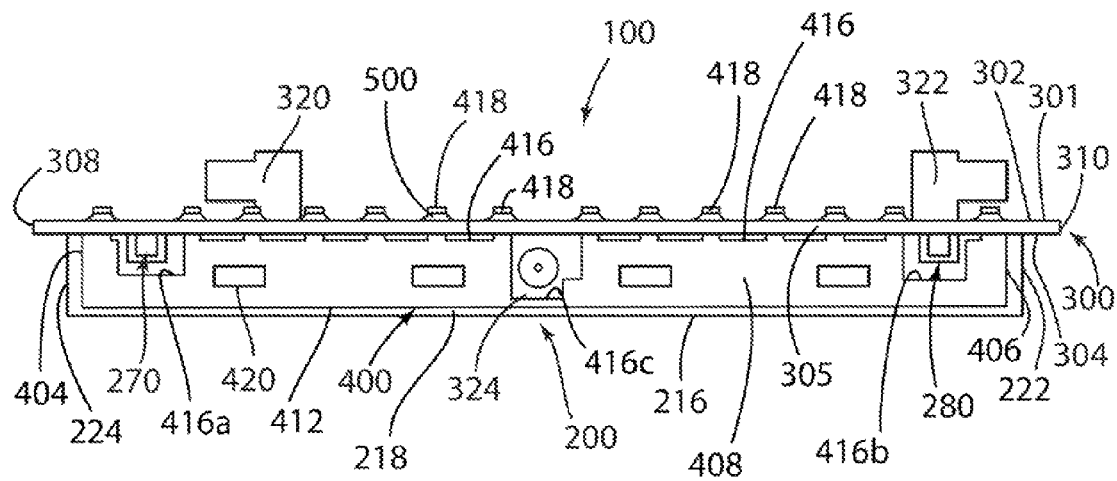
FIG. 2 is a side elevational view of the combination RF monoblock filter and PCB assembly of FIG. 1.
Figure 3:
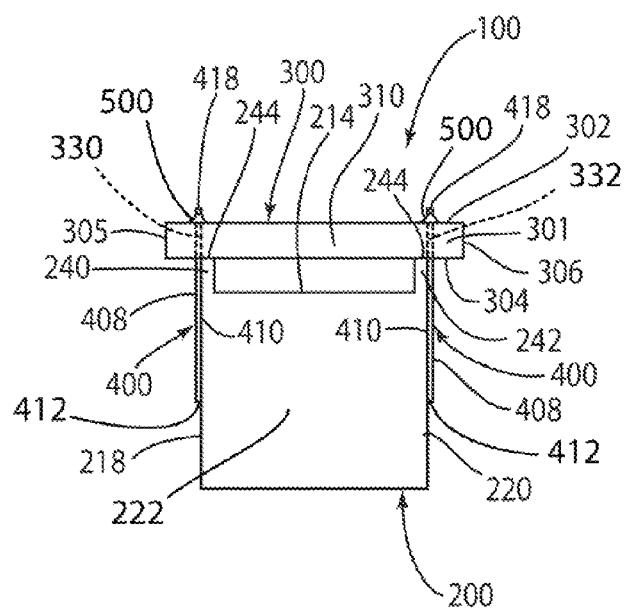
FIG. 3 is an end elevational view of the combination RF monoblock filter and PCB assembly of FIG. 1 without the input/output connectors.

The filter 200 is adapted for mounting to the substrate or printed circuit board (PCB) 300 which, as shown in FIGS. 1, 2, and 3, is comprised of a generally rectangularly-shaped flat plate or substrate 301 including opposed exterior top and bottom horizontal surfaces 302 and 304 respectively, opposed longitudinally extending side vertical surfaces 305 and 306, and opposed end vertical surfaces 308 and 310 extending transversely between the respective ends of the side surfaces 304 and 306.

In the embodiment shown, the printed circuit board 300 also includes a pair of RF input/output connectors 320 and 322 located on the top surface 302 in a diametrically opposed relationship adjacent the side surface 304 and spaced from the opposed end surfaces 308 and 310 respectively. A third connector 324 is generally centrally located on the bottom surface 304 adjacent the side surface 304 and between and spaced from the pair of connectors 320 and 322 on the top surface 302.

The substrate 301 additionally defines first and second rows of spaced apart and co-linearly aligned through-holes or apertures 330 and 332 (FIG. 3) which are adapted to receive the plurality of tabs 418 of the respective brackets 400 as described in more detail below. The first row of apertures 330 is aligned in a relationship spaced, generally parallel to, and between the longitudinal axis $L_2$ (FIG. 1) of the substrate 301 and the substrate side surface 305. The second row of apertures 332 is aligned in a relationship spaced, generally parallel to, and between the longitudinal axis $L_2$ of the substrate 301 and the plate side surface 306. Thus, the first row of apertures 330 is located on one side of the longitudinal axis $L_2$ of the substrate 301 while the second row of apertures 332 is located on the other side of the longitudinal axis $L_2$ of the substrate 301 of the printed circuit board 300.

As shown in FIGS. 1, 2, 3, 4, and 5, a pair of brackets 400 are adapted for mounting to the filter 200 and the printed circuit board 300 as described in more detail below.

Figure 5:
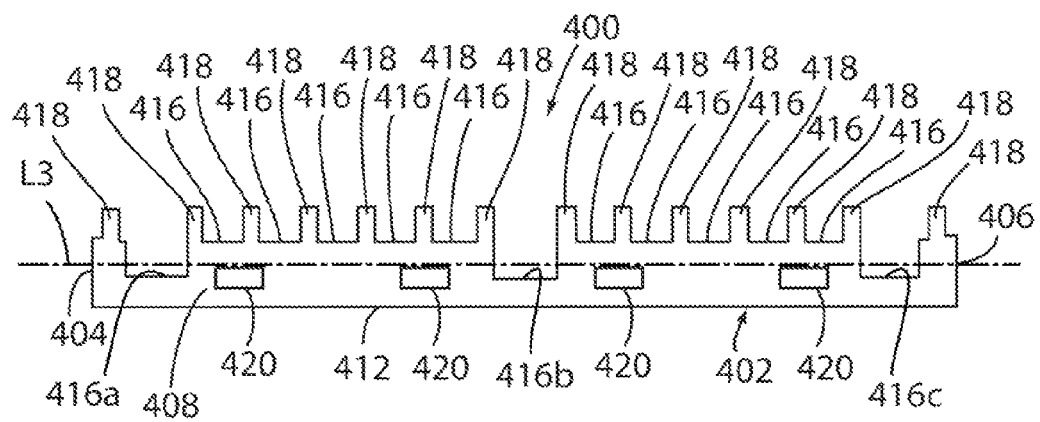
FIG. 5 is a side elevational view of the bracket of the present invention.

Referring to FIG. 5 in particular, each of the brackets 400 is comprised of an elongate flat sheet or plate of metal 402 that includes opposed ends 404 and 406, opposed exterior side surfaces 408 and 410 (FIG. 3), a lower longitudinally extending peripheral edge 412, and a plurality of spaced apart cut-outs or grooves 416 extending along the length of an upper edge of the bracket 400 in a spaced-apart and parallel relationship and defining a plurality of tabs or fingers 418 between each pair of grooves 416 that likewise extend along the length of the upper edge of the bracket 400 in a spaced apart and parallel relationship relative to each other and in a normal relationship relative to the longitudinal axis $L_3$ (FIG. 5) and the lower peripheral edge 412 of the bracket 400.

Three of the grooves 416a, 416b, and 416c are wider and deeper than the remainder of the grooves 416. The groove 416a is located adjacent the end 404 of the bracket 400, the groove 416b is located in a diametrically opposed relationship to the groove 416a and adjacent the opposed end 406 of the bracket 400, and the groove 416c is located centrally on the bracket 400 between the two grooves 416a and 416b.

Each of the brackets 400 additionally defines a plurality of generally rectangularly shaped through-holes or apertures 420 extending through and between the surfaces 408 and 410 of the plate 402. Apertures 420 extend along the length of each of the brackets 400 in a spaced-apart, co-linear, and parallel relationship and are located on the plate 402 between the lower edge 414 and the grooves 416.

Figure 4:
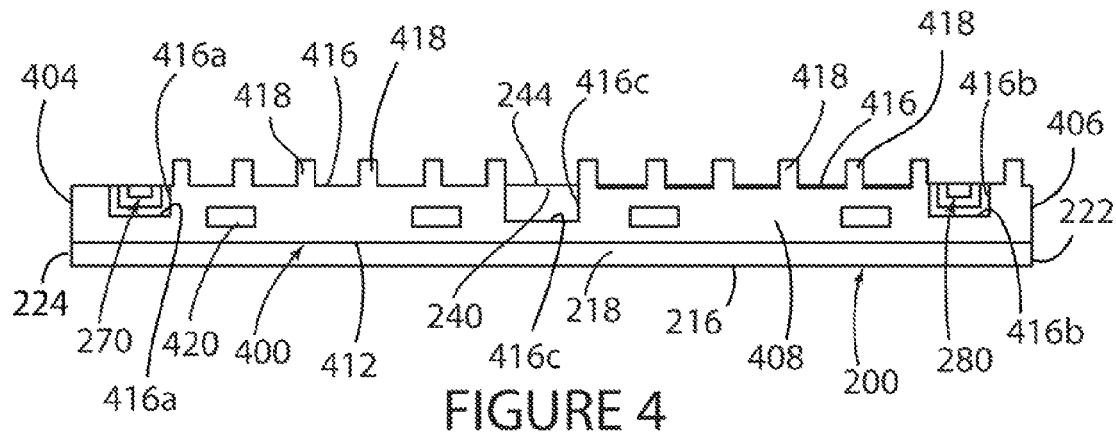
FIG. 4 is a side elevational view of the RF monoblock filter and bracket assembly of FIG. 1 without the PCB.

As shown in FIGS. 3 and 4, the pair of brackets 400 are adapted to be secured to the opposed sides 218 and 220 respectively of the filter 200, as by soldering or the like, in a vertical relationship and orientation wherein the interior side surface 410 of the respective brackets 400 is abutted against the exterior surface of the respective side surfaces 218 and 220 and the exterior surface of the respective walls 240 and 242 of the filter 200; the fingers 418 on the respective brackets 400 protrude upwardly and outwardly away from the top peripheral rim 244 of the respective walls 240 and 242 on the filter 200; and the grooves 416a and 416b in the bracket 400 coupled to the side surface 218 of the filter 200 surround and are spaced from the respective input/output electrodes 270 and 280 defined on the wall 240 of the filter 200.

As shown in FIGS. 1, 2, and 3, the filter 200 is adapted for mounting to the printed circuit board 300 in a relationship wherein the top peripheral rim 244 of the respective walls 240 and 242 of the filter 200 are abutted and soldered against the surface 304 of the board 300; the top surface 214 of the filter 200 is located opposite, parallel to, and spaced from the surface 304 of the board 300; and the fingers 418 on the respective brackets 400 extend through the respective through-holes 330 and 332 in the board 300 and are secured to the board 300 as by soldering to define the plurality of solder joints 500 on the surface 302 of the board 300 and surrounding each of the fingers 418.

Moreover, and although not shown in the FIGURES, it is understood that the input electrode 270 of the filter 200 is attached to a connection pad (not shown) on the surface 304 of the board 300 which, in turn, is coupled to the connector 320 on the board 300 and further that the output electrode 280 is attached to another connection pad (not shown) also on the surface 304 of the board 300 which, in turn, is coupled to the connector 322 on the board 300.

In accordance with the present invention, the brackets 400 as described above advantageously assist in the relief and transfer of the thermal and mechanical stresses on the assembly 100 that result from the use of a filter 200 with walls 240 and 242 and a printed circuit board 300 that are made of materials with different thermal and mechanical characteristics and the brackets 400 reduce the risk of cracking or damage to the filter 200 and the walls 240 and 242 thereof, the printed circuit board 300, and the solder joints 500 during use.

In particular, the brackets 400 advantageously provide and define a reinforcement, or support, or brace for the walls 240 and 242 of the filter 200 thus preventing cracking or damage to the walls 240 and 242 of the filter 200.

The use of brackets 400 with fingers 418 that protrude through and are soldered to the surface 302 of the board 300 also provide mechanical stability to the filter/board assembly 100 and eliminates the risk of separation of the filter 200 from the board 300 in heavy vibration or G-force applications.

Numerous variations and modifications of the embodiment described above may be effected without departing from the spirit and scope of the novel features of the invention. It is to be understood that no limitations with respect to the specific bracket or the combination filter and PCB assembly illustrated herein are intended or should be inferred. It is, of course, intended to cover by the appended claims all such modifications as fall within the scope of the claims.

I claim:

1. An RF filter assembly comprising:
   an RF filter including a block of dielectric material having opposed first and second longitudinally extending side surfaces, a top surface, and opposed elongated first and second side walls projecting upwardly from the respective opposed side walls and upwardly and outwardly from the top surface; and
   first and second separate metal plates abutting and secured to the opposed first and second side surfaces and the first and second side walls respectively of the block of the RF filter and defining respective braces for the first and second side walls of the RF filter.

2. A combination RF filter and printed circuit board assembly comprising:
   a printed circuit board including an exterior surface and a plurality of apertures;
   an RF filter including a top surface and first and second elongated walls extending upwardly and outwardly from the top surface and defining respective first and second top peripheral rims, the RF filter being coupled to the printed circuit board in a relationship with the first and second top peripheral rims of the respective first and second elongated walls of the RF filter abutted against the printed circuit board and the top surface of the RF filter spaced and opposite the exterior surface of the printed circuit board; and
   first and second elongated metal plates abutted against and defining respective braces for the first and second walls of the RF filter and each including a plurality of fingers extending through the plurality of apertures respectively in the printed circuit board.

\* \* \* \* \*